(12) United States Patent
Tomita (10) Patent No.: US 11,909,448 B2
(45) Date of Patent: Feb. 20, 2024

(54) SINGLE-FIBER BI-DIRECTIONAL OPTICAL TRANSCEIVER SUB-ASSEMBLY

(71) Applicant: NEC Corporation, Tokyo (JP)

(72) Inventor: Isao Tomita, Tokyo (JP)

(73) Assignee: NEC CORPORATION, Tokyo (JP)

( * ) Notice: Subject to any disclaimer, the term of this patent is extended or adjusted under 35 U.S.C. 154(b) by 247 days.

(21) Appl. No.: 17/439,519

(22) PCT Filed: Nov. 22, 2019

(86) PCT No.: PCT/JP2019/045854
§ 371 (c)(1),
(2) Date: Sep. 15, 2021

(87) PCT Pub. No.: WO2020/194857
PCT Pub. Date: Oct. 1, 2020

(65) Prior Publication Data
US 2022/0158737 A1    May 19, 2022

(30) Foreign Application Priority Data

Mar. 27, 2019  (JP) ................... 2019-061894

(51) Int. Cl.
*H04B 10/00* (2013.01)
*H04B 10/40* (2013.01)
(Continued)

(52) U.S. Cl.
CPC ........... *H04B 10/40* (2013.01); *G02B 6/4206* (2013.01); *G02B 6/4246* (2013.01); *H04B 10/2581* (2013.01)

(58) Field of Classification Search
CPC .. H04B 10/40; H04B 10/2581; G02B 6/4206; G02B 6/4246; G02B 6/4215;
(Continued)

(56) References Cited

U.S. PATENT DOCUMENTS 5,491,582 A    2/1996  Fujita
10,191,232 B2 *  1/2019  Hwang ............... G02B 6/4215
(Continued)

FOREIGN PATENT DOCUMENTS

| CN | 108152897 A | 6/2018 |
| JP | H5-224103 A | 9/1993 |

(Continued)

OTHER PUBLICATIONS

Japanese Office Action for JP Application No. 2021-508718 dated Nov. 1, 2022 with English Translation.

(Continued)

*Primary Examiner* — Agustin Bello (57) ABSTRACT

Provided is a single-fiber bi-directional optical transceiver sub-assembly capable of improving the wavelength separation characteristics of a multiplexing/demultiplexing filter while also attaining a compact size. A single-fiber bi-directional optical transceiver sub-assembly is provided with a housing, an optical receptacle, a multiplexing/demultiplexing filter, a receiving-side photoelectric converter, a transmitting-side photoelectric converter, an isolator, and a collimating lens. The multiplexing/demultiplexing filter is disposed on the optical path between the optical receptacle and the transmitting-side photoelectric converter and on the optical path between the optical receptacle and the receiving-side photoelectric converter. The isolator passes optical signals outputted from the transmitting-side photoelectric converter and blocks optical signals proceeding to the transmitting-side photoelectric converter. The collimating lens is disposed at a position that fits into the external size of the housing, and collimates incident light on the multiplexing/demultiplexing filter.

8 Claims, 7 Drawing Sheets

(51) Int. Cl.
  *G02B 6/42* (2006.01)
  *H04B 10/2581* (2013.01)
(58) Field of Classification Search
  CPC .. G02B 6/4292; G02B 6/3822; G02B 6/4204; H01L 31/0232; H01L 31/02325; H01S 5/0225
  See application file for complete search history.

(56) References Cited

U.S. PATENT DOCUMENTS

| | | | |
|---|---|---|---|
| 2006/0114579 A1 | 6/2006 | Shibuya et al. | |
| 2006/0280411 A1 | 12/2006 | Nishizawa et al. | |
| 2007/0098335 A1 | 5/2007 | Baek et al. | |
| 2008/0075409 A1 | 3/2008 | Liu | |
| 2011/0052125 A1* | 3/2011 | Lee | G02B 6/4246 385/88 |
| 2016/0013869 A1 | 1/2016 | Teranishi | |
| 2017/0371112 A1* | 12/2017 | Hwang | G02B 6/4208 |
| 2018/0269971 A1* | 9/2018 | Tang | G02B 6/4214 |
| 2020/0012055 A1* | 1/2020 | Ye | H04J 14/0256 |
| 2020/0081203 A1* | 3/2020 | Kihara | G02B 6/4206 |
| 2020/0322061 A1* | 10/2020 | Li | H04B 10/27 |
| 2021/0149129 A1* | 5/2021 | Wei | G02B 6/4213 |
| 2022/0158737 A1* | 5/2022 | Tomita | G02B 6/3822 |

FOREIGN PATENT DOCUMENTS

| | | |
|---|---|---|
| JP | 2002-116354 A | 4/2002 |
| JP | 2003-188444 A | 7/2003 |
| JP | 2006-178382 A | 7/2006 |
| JP | 2006-351608 A | 12/2006 |
| JP | 2010-286683 A | 12/2010 |
| JP | 2016-28415 A | 2/2016 |
| JP | 2017-211419 A | 11/2017 |

OTHER PUBLICATIONS

International Search Report for PCT Application No. PCT/JP2019/045854, dated Dec. 17, 2019.

Chinese Office Action for CN Application No. 201980094343.X dated May 9. 2022 with English Translation.

* cited by examiner

SINGLE-FIBER BI-DIRECTIONAL OPTICAL TRANSCEIVER SUB-ASSEMBLY

This application is a National Stage Entry of PCT/JP2019/045854 filed on Nov. 22, 2019, which claims priority from Japanese Patent Application 2019-061894 filed on Mar. 27, 2019, the contents of all of which are incorporated herein by reference, in their entirety.

TECHNICAL FIELD

The present disclosure relates to a single-fiber bi-directional optical transceiver sub-assembly.

BACKGROUND ART

Optical communication is often used for mobile fronthaul and mobile backhaul on a mobile network. Recently, with the transition from Long Term Evolution (LTE) to 5th Generation (5G), higher transmission speeds in these portions is being demanded.

Single-fiber bi-directional optical transceivers are a type of optical device used for mobile fronthaul and mobile backhaul. Single-fiber bi-directional optical transceivers have functions for transmitting and receiving optical signals, and generally use wavelength multiplexing communication that divides the wavelength band to be used for transmission and reception. Such single-fiber bi-directional optical transceivers are provided with a single-fiber bi-directional optical transceiver sub-assembly referred to as a bi-directional optical sub-assembly (BOSA), for example, as a component.

To meet the demand for higher transmission speeds as described above, it is conceivable to improve the wavelength separation characteristics of a multiplexing/demultiplexing filter built into the BOSA. Accordingly, it is conceivable for the BOSA to be provided with a collimating lens that collimates light incident on the multiplexing/demultiplexing filter into a collimated beam.

Note that Patent Literature 1 describes a technology that adopts a collimating lens as a component of an optical amplifier, while Patent Literature 2 describes a technology that adopts a collimating lens as a component of a three-wavelength multiplexing optical transceiver module.

CITATION LIST

Patent Literature

Patent Literature 1: Japanese Unexamined Patent Application Publication No. 2003-188444
Patent Literature 2: Japanese Unexamined Patent Application Publication No. 2010-286683

SUMMARY OF INVENTION

Technical Problem

However, if one attempts to install a collimating lens in a BOSA, the size of the BOSA increases due to the additional lens.

An object of the present disclosure is to provide a single-fiber bi-directional optical transceiver sub-assembly capable of improving the wavelength separation characteristics of a multiplexing/demultiplexing filter while also attaining a compact size.

Solution to Problem

A single-fiber bi-directional optical transceiver sub-assembly according to an aspect of the present disclosure is provided with:
a housing;
an optical receptacle;
a transmitting-side photoelectric conversion unit;
a receiving-side photoelectric conversion unit;
a multiplexing/demultiplexing filter disposed on an optical path between the optical receptacle and the transmitting-side photoelectric conversion unit and on an optical path between the optical receptacle and the receiving-side photoelectric conversion unit;
an isolator configured to pass an optical signal outputted from the transmitting-side photoelectric conversion unit and block an optical signal proceeding to the transmitting-side photoelectric conversion unit; and
at least one collimating lens, disposed at a position that fits into an external size of the housing, configured to collimate incident light on the multiplexing/demultiplexing filter.

Advantageous Effects of Invention

According to the present disclosure, a single-fiber bi-directional optical transceiver sub-assembly capable of improving the wavelength separation characteristics of a multiplexing/demultiplexing filter while also attaining a compact size can be provided.

DESCRIPTION OF EMBODIMENTS

Hereinafter, example embodiments will be described with reference to the drawings. Note that in the example embodiments, elements that are the same or substantially the same may be denoted with the same signs, and duplicate description of such elements may be omitted in some cases.

First Example Embodiment

Figure 1:
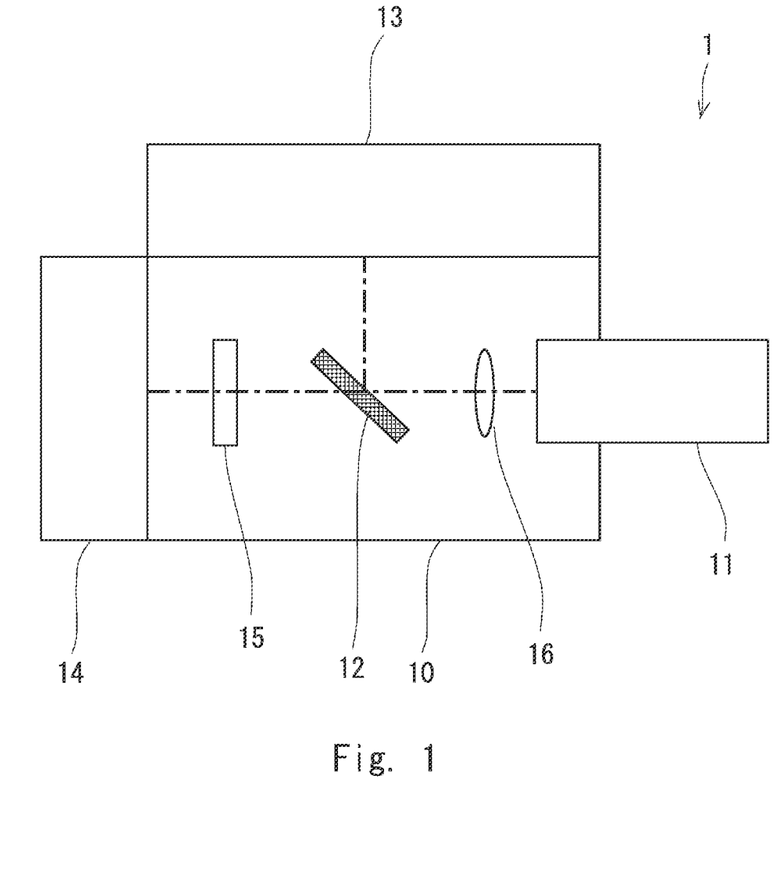
FIG. 1 is a schematic diagram illustrating an example configuration of a single-fiber bi-directional optical transceiver sub-assembly according to a first example embodiment.

A single-fiber bi-directional optical transceiver sub-assembly according to the first example embodiment will be described with reference to FIG. 1. FIG. 1 is a schematic diagram illustrating an example configuration of the single-fiber bi-directional optical transceiver sub-assembly according to the first example embodiment. The single-fiber bi-directional optical transceiver sub-assembly may also be referred to as a bi-directional optical sub-assembly (BOSA), and will be referred to as the BOSA hereinafter.

As illustrated in FIG. 1, a BOSA 1 according to the present example embodiment may be provided with a housing 10, an optical receptacle 11, a multiplexing/demultiplexing filter 12, a receiving-side photoelectric conversion unit 13, a transmitting-side photoelectric conversion unit 14, an isolator 15, and a collimating lens 16.

The BOSA 1 according to the present example embodiment may be installed in a single-fiber bi-directional optical transceiver. The BOSA 1 is capable of performing optical communication by wavelength-division multiplexing (WDM) with another device through an optical fiber, in which an end portion of the optical fiber is included in the optical receptacle 11 for example.

Hereinafter, each component of the BOSA 1 will be described.

The housing 10 may take any shape, but generally has an outline that forms a roughly cuboid shape. The shape of the housing 10 will be described further when describing the other components. Additionally, the housing 10 may be of any material, but generally a metal material is used.

Although details are not illustrated in the diagram, the optical receptacle 11 is a part for making an optical connection between an optical fiber that acts as the transmission line of optical communication and the BOSA 1, and is capable of housing the optical fiber internally. The optical receptacle 11 is disposed in the housing 10 so that the optical fiber (hereinafter, the internal fiber) contained therein can enter light from the multiplexing/demultiplexing filter 12 side and exit light to the multiplexing/demultiplexing filter 12 side.

For example, as illustrated in FIG. 1, the housing 10 may include an opening into which at least a leading portion of the optical receptacle 11 is inserted. However, as the above description makes clear, the shape of the connecting portion of the housing 10 that connects with the optical receptacle 11 is sufficiently any shape that secures an optical path between the optical receptacle 11 and the multiplexing/demultiplexing filter 12. For example, the connecting portion may also have a shape such that the entirety of the optical receptacle 11 is mounted on the outside of the housing 10.

The multiplexing/demultiplexing filter 12 is a filter that multiplexes and demultiplexes optical signals, and although a dielectric multilayer filter can be applied for example, the multiplexing/demultiplexing filter 12 is not limited thereto. Also, the multiplexing/demultiplexing filter 12 may be held by a holder not illustrated while being housed inside the housing 10. The multiplexing/demultiplexing filter 12 is disposed at a position facing the internal fiber of the optical receptacle 11. Particularly, the multiplexing/demultiplexing filter 12 is placed on the optical path between the optical receptacle 11 and the transmitting-side photoelectric conversion unit 14 and on the optical path between the optical receptacle 11 and the receiving-side photoelectric conversion unit 13.

With this arrangement, the multiplexing/demultiplexing filter 12 can multiplexes optical signals having a transmission wavelength outputted from the transmitting-side photoelectric conversion unit 14, and input a multiplexed optical signal into the internal fiber of the optical receptacle 11. Additionally, the multiplexing/demultiplexing filter 12 can demultiplex an optical signal having a reception wavelength outputted from the internal fiber of the optical receptacle 11, and output demultiplexed optical signals to the receiving-side photoelectric conversion unit 13.

The receiving-side photoelectric conversion unit 13 is a part that converts optical signals into electrical signals, and may be a photodiode (PD) module, for example. Hereinafter, the receiving-side photoelectric conversion unit 13 will be referred to as the PD module 13. The transmitting-side photoelectric conversion unit 14 is a part that converts electrical signals into optical signals, and may be a laser diode (LD) module, for example. Hereinafter, the transmitting-side photoelectric conversion unit 14 will be referred to as the LD module 14. Note that such a PD module 13 and LD module 14 may also be referred to as a PD-CAN and LD-CAN, respectively.

Both the PD module 13 and the LD module 14 may be disposed on the outside of the housing 10, but all or part of each module may also be housed inside the housing 10. In the case where the PD module 13 and the LD module 14 are placed on the outside of the housing 10 in at least a partially exposed state, the housing 10 may have an external shape for the placement, such as a recessed shape for example.

The isolator 15 passes optical signals outputted from the LD module 14 and blocks optical signals proceeding to the LD module 14. By such an isolator 15, the LD module 14 operates stably. As illustrated in FIG. 1, the isolator 15 may be positioned on the optical path between the LD module 14 and the multiplexing/demultiplexing filter 12, for example, but is not limited thereto.

The collimating lens 16 that is a main feature of the present example embodiment is a lens capable of collimating light entering the multiplexing/demultiplexing filter 12 (incident light), thereby improving the wavelength separation characteristics of the multiplexing/demultiplexing filter 12.

Furthermore, the collimating lens 16 is disposed at a position that fits into the external size of the housing 10. In other words, the collimating lens 16 is positioned such that no part of the collimating lens 16 protrudes from the external size. The position of the collimating lens 16 illustrated in FIG. 1 is merely an example, and in the BOSA 1 according to the present example embodiment, it is sufficient to dispose at least one collimating lens at a position that fits into the external size of the housing 10. The collimating lens 16 may be of any type, and for example, a GRIN (GRaded INdex) lens, a spherical lens, an aspherical lens, or the like can be applied.

As described above, the BOSA 1 according to the present example embodiment adopts a configuration that stores at least one collimating lens to fit into the external size of the housing 10 (that is, inside the housing 10). Consequently, the BOSA 1 according to the present example embodiment is not only capable of improving the wavelength separation characteristics of the multiplexing/demultiplexing filter 12 due to the addition of the collimating lens, but also an increase in the size of the BOSA due to the addition of the collimating lens can be suppressed.

Second Example Embodiment

Figure 2:
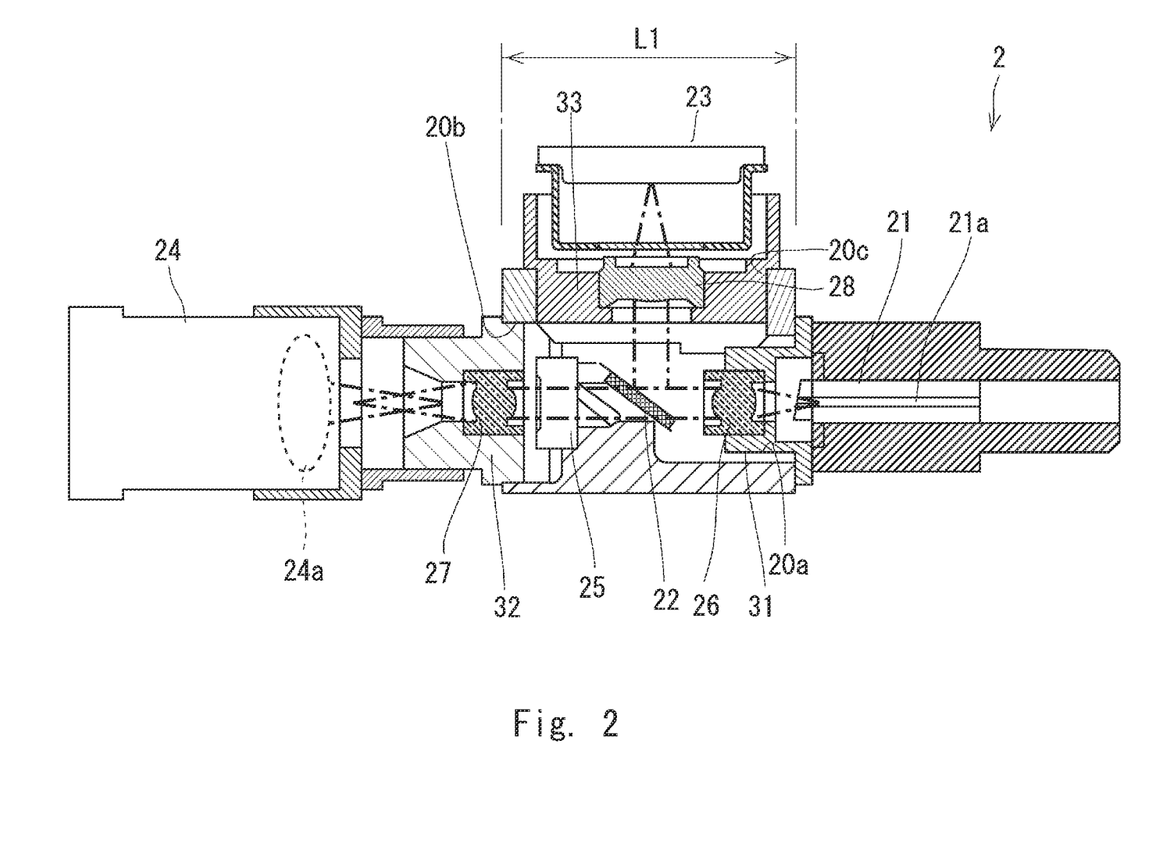
FIG. 2 is a cross section illustrating an example configuration of a BOSA according to a second example embodiment.
Figure 3:
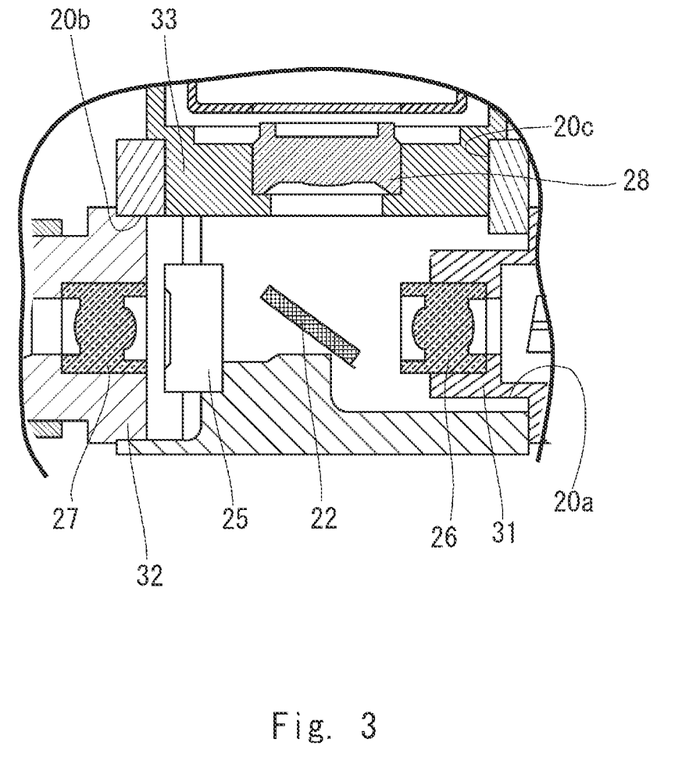
FIG. 3 is an enlarged cross section of a portion of the BOSA in FIG. 2.

In the second example embodiment, the differences from the first example embodiment will be described mainly with reference to FIGS. 2 to 7, but the various examples described in the first example embodiment are applicable. FIG. 2 is a cross section illustrating an example configuration of a BOSA according to the second example embodiment, and FIG. 3 is an enlarged cross section of a portion of the BOSA in FIG. 2.

As illustrated in FIG. 2, a BOSA 2 according to the present example embodiment may be provided with a housing 20, an optical receptacle 21, a multiplexing/demultiplexing filter 22, a PD module 23, an LD module 24, an isolator 25, and first to third collimating lenses 26 to 28.

Here, the housing 20, the optical receptacle 21, and the multiplexing/demultiplexing filter 22 are examples of specific components corresponding to the housing 10, the optical receptacle 11, and the multiplexing/demultiplexing filter 12 in FIG. 1, respectively. Also, the PD module 23, the LD module 24, the isolator 25, and the first collimating lens 26 are examples of specific components corresponding to the PD module 13, the LD module 14, the isolator 15, and the collimating lens 16 in FIG. 1, respectively. Note that the second and third collimating lenses 27 and 28 may be of any type, and for example, a GRIN lens, a spherical lens, an aspherical lens, or the like can be applied.

As illustrated in the example of FIG. 2, the BOSA 2 according to the present example embodiment may be provided with a holder 31 that holds the first collimating lens 26. The holder 31 is disposed at a position where at least a portion of the holder 31 fits into the external size of the housing 20. Additionally, the BOSA 2 may be provided with holders 32 and 33 that hold the second and third collimating lenses 27 and 28, respectively.

The housing 20 may comprise a recessed portion 20c that engages with a portion of the PD module 23 and a portion of the holder 33, a recessed portion 20b that engages with a portion of the LD module 24 and a portion of the holder 32, and a recessed portion 20a that engages with a portion of the holder 31. Note that after these parts engage with each other, the parts may be aligned and then fixed by welding or the like. Also, the housing 20 has a shape allowing the housing portion of the optical receptacle 21 to be connected on the outside of the recessed portion 20a. Note that the connection may be made by welding or the like after aligning the units, for example. In this way, the housing 20 comprises a structure capable of connecting the LD module 24, the PD module 23, and the optical receptacle 21 that connects an optical fiber from the transmission line.

Additionally, a holder that holds the multiplexing/demultiplexing filter 22 and a holder that holds the isolator 25 are provided inside the housing 20. In other words, the housing 20 is configured such that the multiplexing/demultiplexing filter 22 and the isolator 25 can be installed internally. As illustrated in the example of FIG. 2, the multiplexing/demultiplexing filter 22 is mounted at an angle of 45 degrees and 135 degrees for example with respect to the optical axis of incident light from the optical receptacle 11 side and with respect to the optical axis of reflected light proceeding to the PD module 23, respectively.

The optical receptacle 21 is a part for connecting the optical fiber (not illustrated) from the transmission line to the housing 20, and may comprise an internal fiber 21a connected internally to the optical fiber (not illustrated) from the transmission line, as described above.

The multiplexing/demultiplexing filter 22 comprises a function of passing a specific wavelength band among the incident light, and reflecting all other wavelength bands. In other words, the multiplexing/demultiplexing filter 22 passes light proceeding from the LD module 24 to the internal fiber 21a, and reflects light proceeding from the internal fiber 21a (in other words, from the transmission line) to the PD module 23. Note that the latter light is in a different wavelength band than the light from the LD module 24. With this arrangement, the multiplexing/demultiplexing filter 22 can multiplex optical signals outputted from the LD module 24 and input a multiplexed signal into the internal fiber 21a, and also demultiplex an optical signal outputted from the internal fiber 21a and output demultiplexed signals to the PD module 23.

The PD module 23 may include a light-receiving element (not illustrated) such as a PD chip. The LD module 24 may include a light-emitting element (not illustrated) such as an LD chip that acts as a light source, and a lens 24a that condenses light from the light-emitting element onto a predetermined position.

To cause the LD module 24 to operate stably, the isolator 25 prevents reflected light of the LD module 24 from the multiplexing/demultiplexing filter 22 and also from the end face of the internal fiber 21a and the like from returning to the LD module 24. Accordingly, the isolator 25 may be disposed on the optical axis between the LD module 24 and the multiplexing/demultiplexing filter 22.

In the present example embodiment, at least one collimating lens disposed to fit into the external size of the housing 20 is disposed at a position that fits into the width L1 of the PD module 23 in a first direction (the width along the first direction). Here, the first direction refers to the optical axis direction of the optical receptacle 21. Obviously, the position that fits into the width L1 refers to a position external to the PD module 23. The at least one collimating lens that is disposed refers to the first collimating lens 26 in the example of FIG. 2.

The first collimating lens 26 condenses a collimated beam from the multiplexing/demultiplexing filter 22 onto the internal fiber 21a. Accordingly, the first collimating lens 26 may be disposed on the optical path between the multiplexing/demultiplexing filter 22 and the internal fiber 21a of the optical receptacle 21.

Also, the second collimating lens 27 collimates light from the LD module 24 into a collimated beam. Accordingly, the second collimating lens 27 may be disposed on the optical path between the LD module 24 and the isolator 25, for example. However, it is sufficient to dispose the second collimating lens 27 on the optical axis between the LD module 24 and the multiplexing/demultiplexing filter 22, and the isolator 25 may also be disposed on the optical axis between the LD module 24 and the second collimating lens 27. As illustrated in the example of FIG. 2, the second collimating lens 27 does not have to entirely fit into the external size of the housing 20. However, such as by changing the size and shape of the housing 20, the BOSA 2 may be configured such that the second collimating lens 27 is also disposed at a position that fits into the external size of the housing 20.

The third collimating lens 28 condenses a collimated beam from the multiplexing/demultiplexing filter 22 onto the light-receiving element of the PD module 23. Accordingly, the third collimating lens 28 may be disposed on the optical path between the multiplexing/demultiplexing filter 22 and the PD module 23. As illustrated in the example of FIG. 2, the third collimating lens 28 does not have to entirely fit into the external size of the housing 20. However, such as by changing the size and shape of the housing 20, the BOSA 2 may be configured such that the third collimating lens 28 is also disposed at a position that fits into the external size of the housing 20. In this case, if the direction perpendicular to the first direction in FIG. 2 is designed the second direction, the third collimating lens 28 is disposed at a position that fits into the width in the second direction.

In this way, in the BOSA 2, a total of three collimating lenses may be disposed on the optical receptacle 21 side of the multiplexing/demultiplexing filter 22, on the LD module 24 side of the multiplexing/demultiplexing filter 22, and on the PD module 23 side of the multiplexing/demultiplexing filter 22.

Next, operations in the BOSA 2 will be described.

Light emitted from the LD module 24 is condensed once in front of the second collimating lens 27 by the lens 24a inside the LD module 24, and then is incident on the second collimating lens 27 while diffusing. The emitted light from the LD module 24 is made to be a collimated beam by the second collimating lens 27, and passes through the isolator 25 and the multiplexing/demultiplexing filter 22 while remaining a collimated beam. After that, the transmitted light is condensed onto the internal fiber 21a by the first collimating lens 26.

On the other hand, light from the transmission line enters the internal fiber 21a, is incident on the first collimating lens 26 from the internal fiber 21a while diffusing, is made to be a collimated beam by the first collimating lens 26, and is incident on the multiplexing/demultiplexing filter 22. The light from the transmission line is reflected by the multiplexing/demultiplexing filter 22 and condensed onto the light-receiving element (not illustrated) inside the PD module 23 by the third collimating lens 28.

By the first to third collimating lenses 26 to 28, light incident on the multiplexing/demultiplexing filter 22 from the LD module 24 and the internal fiber 21a (in other words, from the transmission line) is made to be a collimated beam. Consequently, the necessary wavelength separation characteristics can be secured, even if the wavelength bands of the light emitted from the LD module 24 (transmission light) and the light incident on the light-receiving element of the PD module 23 (reception light) are close to each other.

Also, as the example configuration described above demonstrates, the BOSA 2 adopts the following configurations (1) to (3) to suppress an increase in the external size of the housing 20 which may occur due to the addition of the first to third collimating lenses 26 to 28.

(1) In the BOSA 2, the isolator 25 is mounted inside the housing 20 rather than outside, and the second collimating lens 27 that collimates light from the LD module 24 into a collimated beam is mounted in the empty space created. The emitted light from the LD module 24 is made to be a collimated beam by the second collimating lens 27, and therefore the distance between the isolator 25 and the multiplexing/demultiplexing filter 22 can be shortened. In addition, the second collimating lens 27 is mounted on the optical axis between the LD module 24 and the isolator 25.

(2) The lens 24a has a fixed focal length, and therefore in the case where a collimating lens is not disposed, it is necessary to position the end face of the internal fiber 21a at the focal point of the lens 24a. Consequently, in the case where a collimating lens is not disposed, it may be necessary to position the internal fiber 21a in close proximity to the multiplexing/demultiplexing filter 22 inside the housing 20. However, in the present example embodiment, the first and second collimating lenses 26 and 27 are disposed to collimate light from the lens 24a side into a collimated beam, and therefore the constraint on the position of the end face of the internal fiber 21a is relaxed. With this arrangement, in the present example embodiment, the internal fiber 21a can be moved back to the end of the housing 20 in the direction going away from the multiplexing/demultiplexing filter 22 while keeping the width of the PD module 23 in the first direction the same. Note that the first collimating lens 26 is mounted in the empty space created by this moving back.

(3) A portion of the third collimating lens 28 is also mounted inside the external size of the housing 20.

Figure 4:
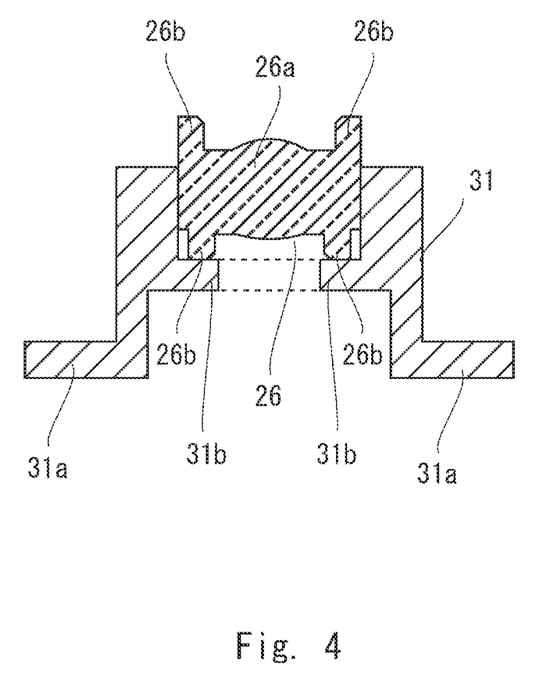
FIG. 4 is a schematic cross section illustrating a first collimating lens and its holder of the BOSA in FIG. 2.
Figure 5:
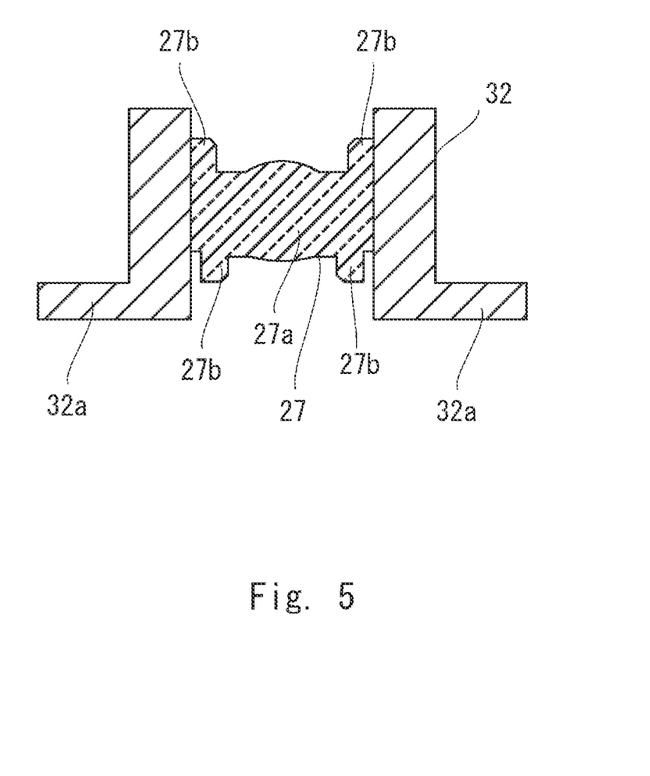
FIG. 5 is a schematic cross section illustrating a second collimating lens and its holder of the BOSA in FIG. 2, and is also a schematic cross section illustrating another example of the first collimating lens and its holder.
Figure 6:
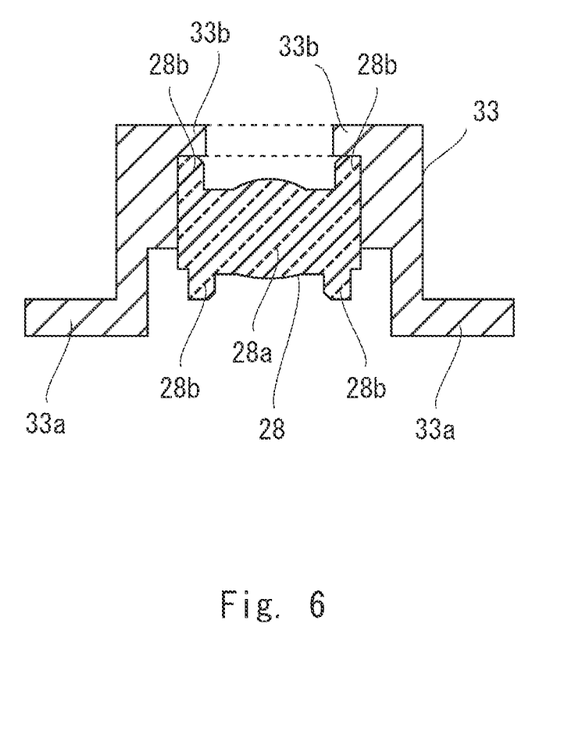
FIG. 6 is a schematic cross section illustrating a third collimating lens and its holder of the BOSA in FIG. 2, and is also a schematic cross section illustrating another example of the first collimating lens and its holder.

Next, examples of the holders of the collimating lenses (lens holders) 31 to 33 will be described with reference to FIGS. 4 to 6. FIG. 4 is a schematic cross section illustrating the first collimating lens 26 and its holder 31 of the BOSA 2. Also, FIG. 5 is a schematic cross section illustrating an example of the second collimating lens 27 and the holder 32 thereof, and is also a schematic cross section illustrating another example of the first collimating lens 26 and the holder thereof that may be installed in the BOSA 2 according to the present example embodiment. FIG. 6 is a schematic cross section illustrating an example of the third collimating lens 28 and the holder 33 thereof, and is also a schematic cross section illustrating another example of the first collimating lens 26 and the holder thereof that may be installed in the BOSA 2 according to the present example embodiment.

As illustrated schematically in FIG. 4, to mount the first collimating lens 26 inside the housing 20, the holder 31 may have a shape that causes the lens barrel surface on the focal point side (the lower side of FIG. 4) of the first collimating lens 26 to abut the inner circumferential surface of the holder 31. Here, the lens barrel surface refers to the outer circumferential surface of a metal lens barrel 26b that covers a lens part 26a in the first collimating lens 26. In other words, the holder 31 has a shape that holds the focal point side of the lens barrel surface in a state in which the first collimating lens 26 protrudes out on the collimating side (the upper side of FIG. 4). The reason for this shape is that, in order to reduce the overall size of the BOSA 2, it is necessary to bring the collimating side (the upper side of FIG. 4) as close to the components inside the housing 20 as possible.

Specifically, the holder 31 may include a circumferential rim 31a provided on the end face of a cylindrical main body, and a circumferential projection 31b provided on the inner circumferential surface of the main body. The rim 31a is a portion that is attached to the outer wall of the housing 20, and the projection 31b is a portion on which the first collimating lens 26 is placed. The projection 31b is provided between the rim 31a and the end face of the main body on the opposite side from the rim 31a. Note that the holder 31 may be attached to the recessed portion 20a on the outer wall of the housing 20 in a state obtained by rotating FIG. 4 90 degrees to the left.

As illustrated schematically in FIG. 5, the holder 32 may have a shape that causes the entire lens barrel surface of the second collimating lens 27 to abut the inner circumferential surface of the holder 32. Here, the lens barrel surface refers to the outer circumferential surface of a metal lens barrel 27b that covers a lens part 27a in the second collimating lens 27.

Specifically, the holder 32 may include a circumferential rim 32a provided on end face of a cylindrical main body. The rim 32a is a portion that is attached to the outer wall of the housing 20. Note that the holder 32 may be attached to the recessed portion 20b on the outer wall of the housing 20 in a state obtained by rotating FIG. 5 90 degrees to the right.

As illustrated schematically in FIG. 6, the holder 33 may have a shape that causes the lens barrel surface on the collimating side (the upper side of FIG. 6) to abut the inner circumferential surface of the holder 33. Here, the lens barrel surface refers to the outer circumferential surface of a metal lens barrel 28b that covers a lens part 28a in the third collimating lens 28.

Specifically, the holder 33 may include a circumferential rim 33a provided on the end face of a cylindrical main body, and a circumferential projection 33b provided on the inner circumferential surface of the end face of the main body on the opposite side from the rim 33a. The rim 33a is a portion that is attached to the outer wall of the housing 20, and the projection 33b is a portion on which the third collimating lens 28 is placed. Note that the holder 33 may be attached to the recessed portion 20c on the outer wall of the housing 20 in a state obtained by inverting FIG. 6 vertically.

Additionally, a holder shaped like the holder 32 or the holder 33 may also be adopted as the holder that holds the first collimating lens 26. However, because it is necessary to bring the collimating side as close to the internal components as possible to reduce the overall size of the BOSA 2, a shape like the holder 31 in FIG. 4 is considered preferable as the holder that holds the first collimating lens 26.

Figure 7:
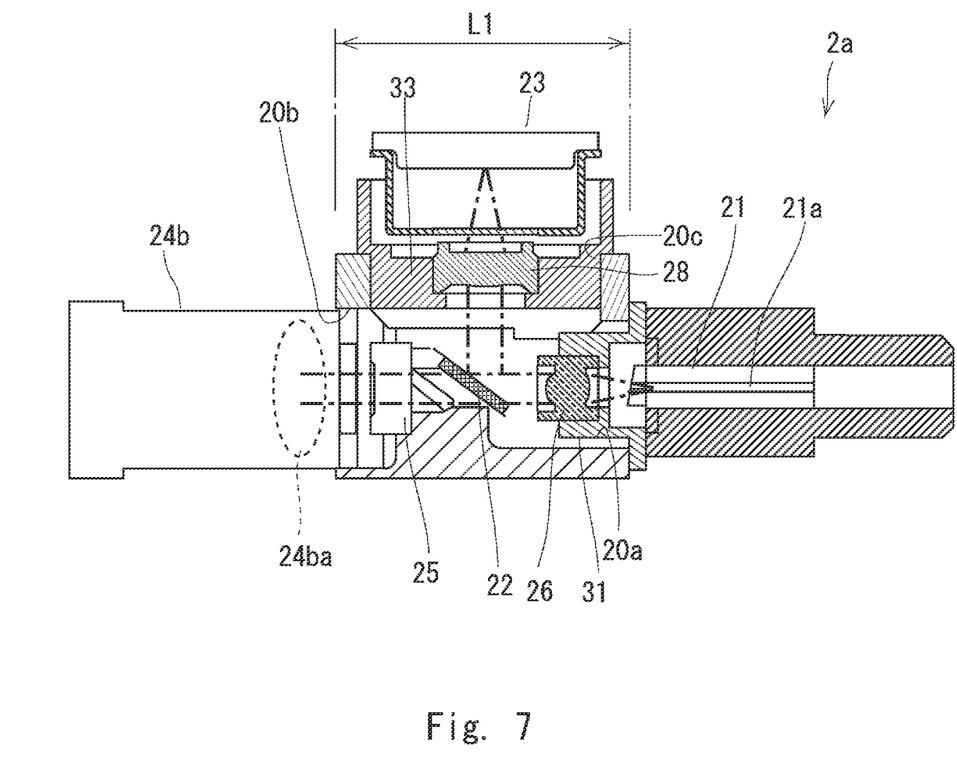
FIG. 7 is a cross section illustrating another example configuration of the BOSA according to the second example embodiment.

Here, an example configuration excluding the second collimating lens 27 will be described briefly with reference to FIG. 7. FIG. 7 is a cross section illustrating another example configuration of the BOSA according to the present example embodiment. A BOSA 2a illustrated in FIG. 7 is obtained by removing the second collimating lens 27 and the holder 32 thereof and installing an LD module 24b instead of the LD module 24 in the BOSA 2 illustrated in FIG. 2. The LD module 24b here may be a Goldbox-type module for example that includes a second collimating lens 24ba. Note that the recessed portion 20b has a shape that engages with a portion of the LD module 24b.

As described above, according to the present example embodiment, a BOSA 2 or 2a capable of improving the wavelength separation characteristics of the multiplexing/demultiplexing filter 22 while also attaining a compact size can be provided. Specifically, in the present example embodiment, the first to third collimating lenses 26 to 28 or 26, 24ba, and 28 are installed such that a collimated beam can be incident on the multiplexing/demultiplexing filter 22, and the wavelength separation characteristics of the multiplexing/demultiplexing filter 22 are improved. Furthermore, in the present example embodiment, the external size of the housing 20 can be kept to substantially the same outer size as the case where the first to third collimating lenses 26 to 28 or 26, 24ba, and 28 are not installed.

A supplementary explanation of the improvement of the wavelength separation characteristics will be given. The wavelength separation characteristics of a multiplexing/demultiplexing filter tend to be optimal in the case where the incident light on the multiplexing/demultiplexing filter is a collimated beam, and tend to degrade in the case where the incident light on the multiplexing/demultiplexing filter is incident while being condensed or diffused. In the latter case, that is, in the case where the incident light on the multiplexing/demultiplexing filter is not a collimated beam, it is necessary to separate the wavelength band of the light from the LD module (transmission light) and the wavelength band of the light to the PD module (reception light) sufficiently. Consequently, an optical signal with a wavelength of 1.27 μm and an optical signal with a wavelength of 1.33 μm are used by performing wavelength multiplexing, for example.

The present example embodiment is configured such that a collimated beam can be incident on the multiplexing/demultiplexing filter 22, thereby making it possible to improve the wavelength separation characteristics in the case where the wavelength band of the transmission light and the wavelength band of the reception light are close. For example, according to the present example embodiment, an optical signal with a wavelength of 1.27 μm and an optical signal with a wavelength of 1.31 μm closer to the zero-dispersion wavelength band can be used, making it possible to attain faster transmission speeds. For example, the BOSA 2 comprising a structure as described above may be installed in a single-fiber bi-directional optical transceiver and serve as one technology for improving transmission speeds from 10 Gb/s or less to 25 Gb/s.

Also, as illustrated by the example of the first collimating lens 26, a collimating lens disposed on the optical path between the multiplexing/demultiplexing filter 22 and the internal fiber 21a of the optical receptacle 21 can be disposed to fit into the external size of the housing 20. With this configuration, the first collimating lens 26 can be fixed after fixing the LD module 24 side, and then the alignment of the internal fiber 21a can be performed easily when attaching the optical receptacle 21 thereafter.

Other Example Embodiments

The example embodiments above describe an example configuration of a BOSA, but the shape and configuration are not limited to the illustrated examples. For example, in the second example embodiment, as described above, an example is given in which only the first collimating lens 26 among the collimating lenses installed in the BOSA 2 or 2a fits into the external size of the housing 20. However, the BOSA 2 may adopt a configuration such that only the second collimating lens 27 fits into the external size of the housing 20. Also, the BOSA 2 or 2a may also adopt a configuration such that only the third collimating lens 28 fits into the external size of the housing 20 (in this case, the size in the vertical direction of FIG. 2). Furthermore, the BOSA 2 or 2a may also adopt a configuration such that two or three of the first to third collimating lenses fit into the external size of the housing 20. Obviously, the first and second example embodiments may also adopt a configuration provided with two collimating lenses or a configuration provided with four or more collimating lenses. Moreover, the various examples described in the first and second example embodiments can be combined where appropriate.

Note that the present disclosure is not limited to the various example embodiments described above, and appropriate modifications are possible within a scope that does not depart from the gist. Moreover, the present disclosure may also be carried out by appropriately combining respective example embodiments.

The present invention has been described with reference to example embodiments, but the present invention is not limited by the foregoing. The configuration and details of the present invention may be subjected to various modifications that would occur to persons skilled in the art within the scope of the invention.

This application claims priority to Japanese Patent Application No. 2019-061894 filed in the Japan Patent Office on Mar. 27, 2019, the disclosure of which is incorporated by reference in its entirety.

REFERENCE SIGNS LIST 1, 2, 2a BOSA
10, 20 housing
11, 21 optical receptacle
12 multiplexing/demultiplexing filter
13 receiving-side photoelectric conversion unit (PD module)

14 transmitting-side photoelectric conversion unit (LD module)
15, 25 isolator
16 collimating lens
20a, 20b, 20c recessed portion
21a internal fiber
22 multiplexing/demultiplexing filter
23 PD module
24, 24b LD module
24a lens
26 first collimating lens
26a, 27a, 28a lens part
26b, 27b, 28b lens barrel
27, 24ba second collimating lens
28 third collimating lens
31, 32, 33 holder
31a, 32a, 33a rim
31b, 33b projection

What is claimed is:

1. A single-fiber bi-directional optical transceiver subassembly comprising:
a housing;
an optical receptacle;
a transmitting-side photoelectric converter;
a receiving-side photoelectric converter;
a multiplexing/demultiplexing filter disposed on an optical path between the optical receptacle and the transmitting-side photoelectric converter and on an optical path between the optical receptacle and the receiving-side photoelectric converter;
an isolator configured to pass an optical signal outputted from the transmitting-side photoelectric converter and block an optical signal proceeding to the transmitting-side photoelectric converter;
a first collimating lens, disposed on an optical axis between the optical receptacle and the multiplexing/demultiplexing filter, disposed at a position that fits into an external size of the housing, and configured to collimate incident light on the multiplexing/demultiplexing filter; and
a second collimating lens disposed on an optical axis between the transmitting-side photoelectric converter and the multiplexing/demultiplexing filter, wherein
the first collimating lens is disposed at a position within a width along a first direction of the receiving-side photoelectric converter, the first direction being an optical axis direction of the optical receptacle,
the isolator is disposed on the optical axis between the transmitting-side photoelectric converter and the multiplexing/demultiplexing filter, and
the second collimating lens is disposed on an optical axis between the transmitting-side photoelectric converter and the isolator.

2. The single-fiber bi-directional optical transceiver subassembly according to claim 1, further comprising a first holder configured to hold the first collimating lens,
wherein at least a portion of the first holder is disposed at a position that fits into the external size of the housing.

3. The single-fiber bi-directional optical transceiver subassembly according to claim 1, wherein the second collimating lens is disposed at a position that fits into the external size of the housing.

4. The single-fiber bi-directional optical transceiver subassembly according to claim 3, further comprising a second holder configured to hold the second collimating lens,
wherein a portion of the second holder is disposed at a position that fits into the external size of the housing.

5. The single-fiber bi-directional optical transceiver subassembly according to claim 1, further comprising a third collimating lens disposed on an optical axis between the receiving-side photoelectric converter and the multiplexing/demultiplexing filter.

6. The single-fiber bi-directional optical transceiver subassembly according to claim 5, wherein the third collimating lens is disposed at a position that fits into the external size of the housing.

7. The single-fiber bi-directional optical transceiver subassembly according to claim 6, further comprising a third holder configured to hold the third collimating lens,
wherein a portion of the third holder is disposed at a position that fits into the external size of the housing.

8. The single-fiber bi-directional optical transceiver subassembly according to claim 1, wherein the transmitting-side photoelectric converter, the second collimating lens, the isolator, the multiplexing/demultiplexing filter, and the first collimating lens are linearly arranged on a same optical path.

* * * * *